United States Patent [19]

Martens et al.

[11] Patent Number: 5,239,269
[45] Date of Patent: Aug. 24, 1993

[54] APPARATUS AND METHOD FOR MEASURING AND IMAGING SURFACE RESISTANCE

[75] Inventors: Jon S. Martens, Albuquerque; Vincent M. Hietala, Placitas, both of N. Mex.; Gert K. G. Hohenwarter, Madison, Wis.

[73] Assignee: The United States of America as represented by the United States Department of Energy, Washington, D.C.

[21] Appl. No.: 789,225

[22] Filed: Nov. 7, 1991

[51] Int. Cl.[5] ............................................. G01R 27/32
[52] U.S. Cl. .................................... 324/632; 324/71.6; 324/719; 324/633; 324/644; 324/636
[58] Field of Search ............... 324/642, 646, 693, 707, 324/708, 722, 724, 632, 633, 636, 71.6, 719

[56] References Cited

U.S. PATENT DOCUMENTS

| | | | |
|---|---|---|---|
| 2,489,092 | 11/1949 | Larrick | 324/642 |
| 4,492,915 | 1/1985 | Caspers | 324/644 |
| 4,873,444 | 10/1989 | Cooke et al. | 250/337 |
| 4,968,945 | 11/1990 | Woskov et al. | 324/708 X |

OTHER PUBLICATIONS

The effects of processing sequences on the microwave surface resistance of TlGaBaCuO, Martens, J. Appl. Phys. 69(12), Jun. 15, 1991.
Confocal resonators for measuring the surface resistance of high-temperature superconducting films, Martens, Appl. Phys. Lett. 58(22), Jun. 3, 1991.
Ginley, et al., "Morphology Control and High Critical Currents in Superconducting Thin Films in the Tl-Ca-Ba-Cu-O System" Physica C, vol. 160 pp. 42-48 (1989) Dec.
Keyes, et al., "The Role of Low Temperatures in the Operation of Logic Circuitry" Proceedings of the IEEE, vol. 58, No. 12 pp. 1914-1932 (Dec. 1970).
Schawlow, et al., "Infrared and Optical Masers" Physical Review, vol. 112, No. 6, pp. 1940-1949 (Dec. 1958).
Lonngren, et al., "On the Focused Fabry-Perot Resonator in Plasma Diagnostics" iEEE Transactions on Microwave Theory and Techniques, vol. MMT-12, pp. 548-549 (1964)/Dec.
Martens, et al., "Microwave Surface Resistance of YBa2Cu3 O6.9 Superconducting Films", Applied Phys. Lett., vol. 52 (No. 21) pp. 1822-1824 (May 1988).

Primary Examiner—Kenneth A. Wieder
Assistant Examiner—Jose M. Solis
Attorney, Agent, or Firm—George H. Libman; Gregory A. Cone

[57] ABSTRACT

Apparatus and method for determining and imaging superconductor surface resistance. The apparatus comprises modified Gaussian confocal resonator structure with the sample remote from the radiating mirror. Surface resistance is determined by analyzing and imaging reflected microwaves; imaging reveals anomalies due to surface impurities, non-stoichiometry, and the like, in the surface of the superconductor.

29 Claims, 5 Drawing Sheets

FIG. I

APPARATUS AND METHOD FOR MEASURING AND IMAGING SURFACE RESISTANCE

GOVERNMENT RIGHTS

The U.S. Government has a paid-up license in this invention and the right in limited circumstances to require the patent owner to license others on reasonable terms as provided for by certain contract terms.

BACKGROUND OF THE INVENTION

1. Field of the Invention (Technical Field)

The present invention relates to apparatus for measuring and imaging surface resistance in a superconductor; and a method of using the apparatus.

2. Background Art

The advent of numerous new, relatively high critical temperature, superconducting alloys and materials has brought with it a commensurate need to measure various properties of such materials, such as surface resistance and consistency. For example, U.S. Pat. No. 4,873,444, entitled *Detection of Surface Impurity Phases in High-Tc Superconductors Using Thermally Stimulated Luminescence*, to Cooke, et al., discloses a process of detecting surface impurities by irradiating a sample with ionizing radiation, heating the irradiated sample to luminescence, and comparing the integrated luminescence with a calibration curve to determine surface resistance. This process, however, necessarily suffers from the disadvantage of testing the samples under normal conducting states, rather than under operational superconducting states.

"Morphology Control and High Critical Currents in Superconducting Thin Films in the Tl-Ca-Ba-Cu-O System," by D. S. Ginley, et al., *Physica C*, Vol. 160, pp. 42–48 (1989), discusses superconducting polycrystalline thin films in the Tl-Ca-Ba-Cu-O system with extremely high transition temperatures.

In "The Role of Low Temperatures in the Operation of Logic Circuitry," (*Proceedings of the IEEE*, Vol. 58, No. 12, pp. 1914–1932 (December 1970), R. W. Keyes, et al., discuss the suggested advantages and possible disadvantages of operative logic circuitry at low temperatures.

A. L. Schawlow, et al., in "Infrared and Optical Masers," *Physical Review*, Vol. 112, Number 6, pp. 1940–1949 (December 1958). discuss maser oscillation using resonant cavities of microwave dimensions.

K. E. Lonngren, et al., in an article entitled "On the Focused Fabry-Perot Resonator in Plasma Diagnostics," appearing in *IEEE Transactions on Microwave Theory and Techniques*, Vol. MTT-12, pp. 548–549 (1964), discuss plasma diagnostics using a Fabry-Perot resonator at frequencies lower than microwave frequencies.

Wavemeter cavities for measuring surface resistance of superconductors are also known in the prior art, as disclosed in "Microwave Surface Resistance of YBa$_2$Cu$_3$O$_{6.9}$ Superconducting Films," *Appl. Phys. Lett.*, Vol. 52, No. 21, 23 May, 1988, pp. 1822–1824. While this process permits surface resistance measurement under superconducting conditions, the sample must be in contact with the cavity itself, complicating the measurement process and requiring additional energy to maintain cryogenic conditions.

Confocal resonators, that is, resonators, comprising two spherical mirrors with the center of curvature of each mirror at the other spherical surface, are also known in the prior art. Such resonators are known in the prior art, for example, for measuring dielectric constants of various insulating materials.

SUMMARY OF THE INVENTION

(DISCLOSURE OF THE INVENTION)

The present invention is of methods and apparatuses for determining and imaging the surface resistance of a sample.

A first method and apparatus of the invention for determining and imaging the surface resistance of a sample involves the steps of, and means for:

a) generating electromagnetic radiation in the frequency range of $10^9$ to $10^{12}$ Hz;

b) radiating the electromagnetic radiation;

c) reflecting the radiated electromagnetic radiation from a remote sample; and d) determining and imaging surface resistance of the sample from the reflected electromagnetic radiation.

In the preferred embodiment, generating electromagnetic radiation comprises providing a network analyzer. Radiating the electromagnetic radiation preferably comprises providing a mirror having a radius of curvature b and positioning the sample at a distance of b/2 from the mirror, and reflecting the radiated electromagnetic radiation from a remote sample preferably comprises supercooling the sample. Determining and imaging surface resistance of the sample from the reflected electromagnetic radiation comprises determining $R_{ss}$ from the algorithm:

$$R_{s,sample} = \frac{\omega^2 \mu_0^2 b^3 \epsilon_0}{16\, Q_t b k (bk + 2)} - \frac{3\, bk R_{s,mirror}}{4\, (bk + 2)}$$

where the total quality factor, $Q_t$, is known, $R_{sm}$ (mirror surface resistance) is known, $\omega = 2\pi f_o$, $\mu_o = 4\pi 10^{-7}$ H/m, $\epsilon = 8.854 \cdot 10^{-12}$ F/m, and $k = \omega/3 \cdot 10^8$, as well as imaging surface resistance anomalies on the surface of the sample. The invention preferably also comprises coupling electromagnetic radiation by providing a waveguide between the electromagnetic radiation generator and the electromagnetic radiation radiator.

A second method and apparatus of the invention for determining and imaging surface resistance of a sample involve the steps of, and means for:

a) generating electromagnetic radiation;

b) radiating the electromagnetic radiation from a mirror having a radius of curvature b;

c) positioning a remote sample at a distance of b/2 from the mirror for reflecting the electromagnetic radiation; and d) determining and imaging the surface resistance of the remote sample from the reflected electromagnetic radiation.

In the preferred embodiment, generating electromagnetic radiation comprises generating microwave radiation, radiating electromagnetic radiation from a mirror comprises generating electromagnetic radiation from a concave mirror, positioning a remote sample comprises supercooling the sample. The invention preferably further comprises coupling by waveguide the electromagnetic radiation generator and the electromagnetic radiation radiator.

An object of the preferred embodiment of the invention is the provision of apparatus and method for measuring and imaging surface resistance of superconductors under superconducting conditions.

Another object of the preferred embodiment of the invention is the improvement of measurement sensitivity by concentration of electromagnetic fields at the sample.

Yet another object of the preferred embodiment of the invention is the use of smaller samples at higher frequencies.

An advantage of the invention is that the sample does not need to be patterned as with transmission line measurement techniques.

Another advantage of the invention is that there is no limit on sample size.

Yet another advantage of the invention is that the sample is remote from the measurement apparatus.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

DESCRIPTION OF THE PREFERRED EMBODIMENTS (BEST MODES FOR CARRYING OUT THE INVENTION)

Figure 1:
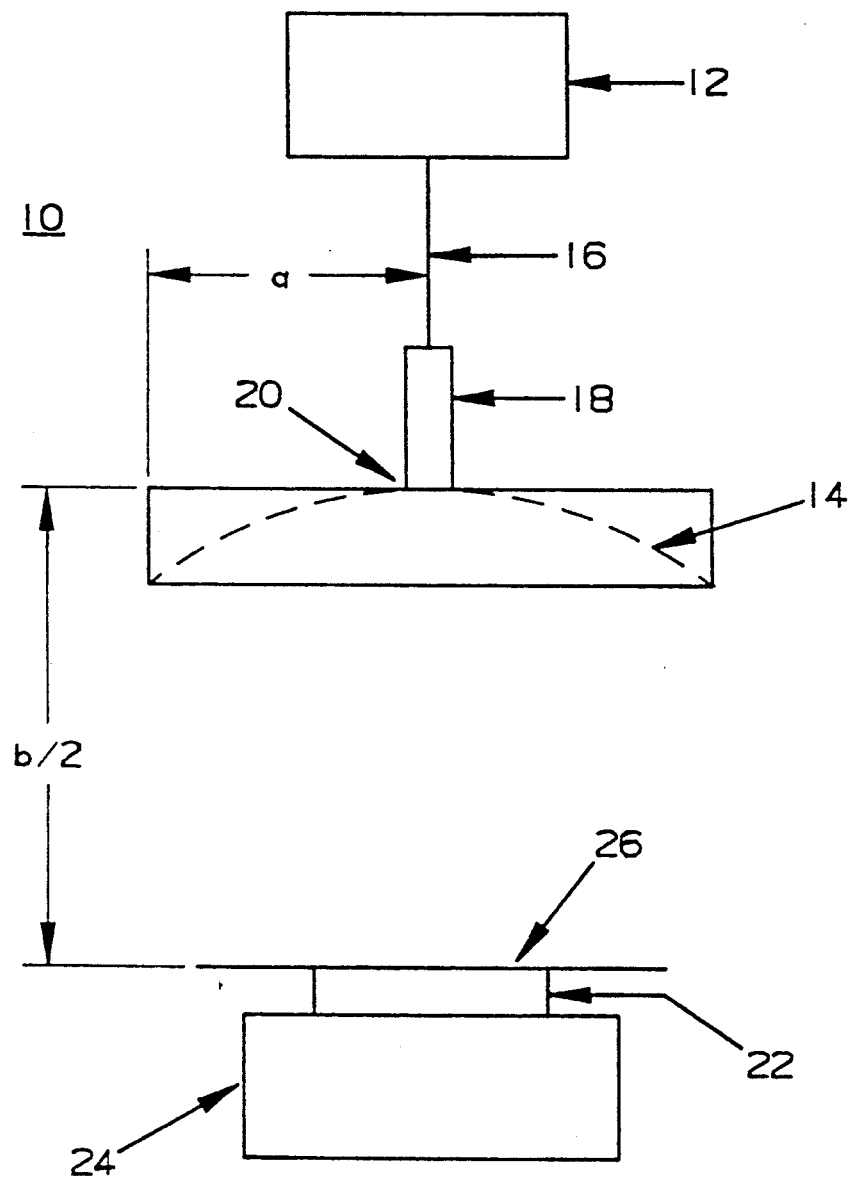
FIG. 1 schematically depicts the preferred apparatus of the invention.

FIG. 1 schematically depicts the preferred apparatus 10 of the invention. As shown therein, apparatus 10 comprises network analyzer and image processor 12, for example, a Hewlett Packard 8510, which in turn comprises a microwave frequency source ($10^9$ to $10^{12}$ Hz), for example, a Hewlett Packard 8340, detectors, couplers, computer/controller, and circuitry for measuring and imaging incident and reflected radiation. Microwave energy, both incident and reflected, is coupled to concave (spherical) mirror 14 by coaxial cable 16 and waveguide 18 through excitation port 20. Mirror 14 may comprise, for example, normal conducting metals such as aluminum, silver, copper, and the like, as well as superconducting materials. Even semiconductors may be used under some circumstances.

Classic confocal resonator structure comprises two concave mirrors with the center curvature of each mirror at the concave surface of the other mirror (for example, a radius of curvature b). As shown in FIG. 1, this resonator structure has been modified such that the sample 22 is at a distance of half the standard radius of curvature of concave mirror 14. This modified resonator structure provides the advantage of permitting testing of remote sample 22 under superconducting conditions, while the testing equipment itself can remain at room temperature.

Further, this modified structure ensures that electromagnetic waves arriving at the sample 22 are nearly planar; the magnetic field is at maximum at the sample resulting in increased sensitivity, since losses are concentrated in the sample—not the mirror.

Sample analysis assumes that the dimensions of mirror 14 (a=mirror radius; b=radius of curvature) greatly exceed free space wavelength ($\lambda$, and that the sample 22 (or sample+base plate 26, needed for smaller samples) exceeds the spot size $$\left(\text{spot size} = \sqrt{\frac{b\lambda}{(2\pi)}}\right) \text{of the Gaussian beam}.$$

$Q_{resonator}$ (Q = quality factor) due to conductor loss is computed by perturbation techniques. $Q_{radiation}$ exceeds $10^7$, thus these radiation losses can be neglected. Likewise, coupling losses can be neglected, since $Q_{coupling}$ exceeds $10^6$. The total (known) quality factor, $Q_t$, can be expressed as:

$$Q_t = \frac{\omega^3 \mu_0^2 b^3 \epsilon}{32\{R_{ss}[0.5\ b^2k^2 + bk] + R_{sm}[0.375\ b^2k^2]\}} \quad (1)$$

where $R_{ss}$ is the sample surface resistance to be computed, $R_{sm}$ is mirror surface resistance (known), b=wave number=$\omega/c$, where $\omega = 2\pi f_o$. Other values include b=radius of curvature of the mirror, $\mu_o = 4\pi \cdot 10^{-7}$ H/m, and $\epsilon$ (permittivity=$8.854 \cdot 10^{-12}$ F/m). Expressed otherwise:

$$R_{s,sample} = \frac{\omega^2 \mu_0^2 b^3 \epsilon_0}{16\ Q_t bk(bk + 2)} - \frac{3\ bk R_{s,mirror}}{4\ (bk + 2)} \quad (1a)$$

Figure 2:
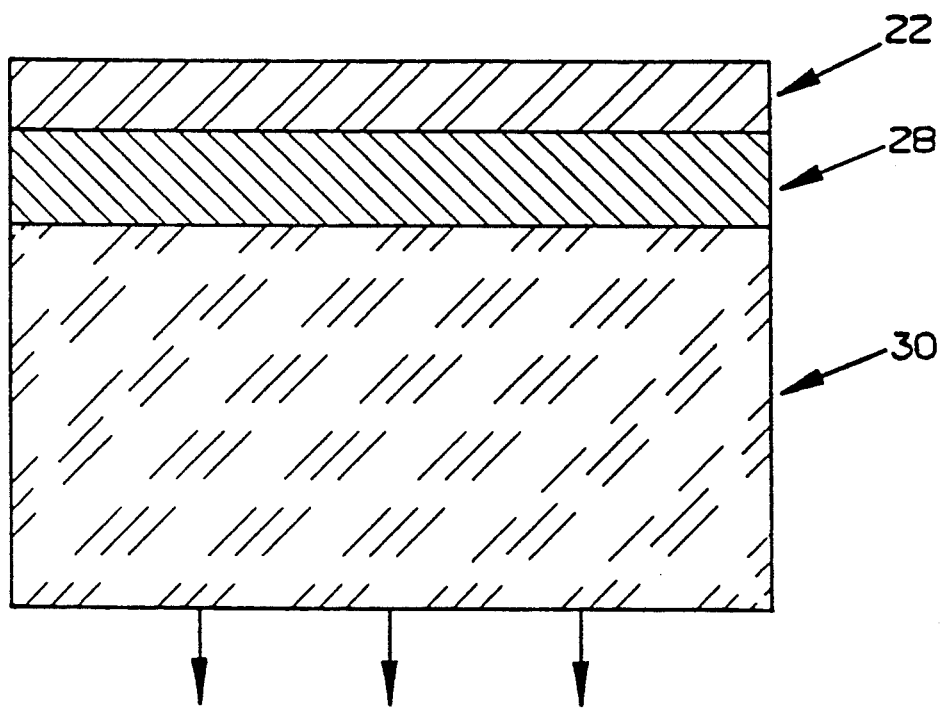
FIG. 2 shows the sample and sample holder of the invention.

Sample holder 24, as depicted in FIGS. 1 and 2, comprises a post 30 of copper, aluminum or other normal or superconducting metal. Post 30 of copper or other normal metal is provided with superconducting equipment, for example, baths or conduits of liquid He or $N_2$, cryostat structure, Dewar flask structure, or the like. A thin film high $T_c$ superconductor sample 22 to be tested is grown upon a substrate 28 held by the sample holder 24. If a bulk sample is to be tested, it is mounted directly on the sample holder, and no substrate is utilized.

In the case of small samples (on the order of the spot size), a normal metal base plate 26 (surface resistance $R_{sb}$) surrounding the sample can be used, as shown in FIG. 1. A thin dielectric slab (glass) with a gold film on the bottom is used with a hole in the film for sample exposure. The hole should be as close to the sample size as possible for maximum sensitivity. The normalized radius of the superconducting region is $$A = (\text{physical radius}) \sqrt{2k/b}\ .$$

In this situation, $$Q_t = \frac{\omega^3\mu_0^2 b^3 \epsilon_0}{32 \{R_{ss}[[0.5\ b^2k^2 + bk][1 - \exp\{-A^2\}] - \exp\{-A^2\}[bkA^2 + 0.5\ A^4]] +} \quad (2)$$
$$R_{sm}[0.375\ b^2k^2] + R_{sb}\exp\{-A^2\}[bk + 0.5\ b^2k^2 + bkA^2 + 0.5\ A^4]\}$$

or, $$R_{s,sample} = \frac{\omega^3\mu_0^2 b^3\epsilon_0 - 3\ R_{s,mirror}Q_t b^2k^2 - 4\ R_{s,base}e^{-A^2}(2bk + b^2k^2 + 2\ bkA^2 + A^4)}{4\ Q_t[bk(bk + 2)(1 - e^{-A^2}) - A^2e^{-A^2}(2bk + A^2)]}. \quad (2a)$$

Since the electric fields are low at the sample, to "first order" the Q will change only because of dielectric loss. The shift in resonant frequency and the shift in Q can be computed using perturbation techniques giving:

$$\frac{\Delta f_0}{f_0} = \approx (\epsilon_1 - 1)\ X/2 \qquad \frac{1}{Q^{new}} - \frac{1}{Q^{old}} \approx -\epsilon_2 X \quad (3)$$

where $X = e^{-2}\ Im\left[\frac{e^{j2kd}}{kb - j2kd}\left(1 - \frac{1}{kb - j2kd}\right)\right] +$ $\frac{[1 - e^{-2}]\sin[2kd]}{bk} - \frac{2d}{b}.$ The dielectric support sheet is assumed to have permittivity $\epsilon_0(\epsilon_1 - j\epsilon_2)$ with $\epsilon_2/\epsilon_1 \ll 1$. The dielectric thickness d must be much less than the wavelength in the dielectric.

EXAMPLES (INDUSTRIAL APPLICABILITY)

The invention is further illustrated by the following nonlimiting examples.

Calibration and verification of the method and apparatus was performed using normal metals. The surface resistance of the aluminum mirror (b=0.1100 m and a=0.0381 m) was evaluated using a pure copper sample at room temperature. The Cu sample surface resistance had been measured with cavity techniques previously and showed a nearly ideal value of 49.7 mΩ at 36.136 GHz (corrected from data measured at 9.87 GHz, assuming $f^{0.5}$ dependence). The mirror surface resistance was found to be 61.9 mΩ (36.136 GHz). All Qs were determined using reflection data measured on a HP 8510B network analyzer (using Ginzton's method of impedances). The mirror surface resistance value was repeatable to within ±0.2 mΩ in ten experiments over a period of several weeks. Values for $R_{sm}$ were found for frequencies ranging from 29–40 GHz (TEM$_{00n}$ resonances determined by $4b/\lambda = 2n + 1$).

The copper sample was then cooled to 77 K. At 36.136 GHz, the measured surface resistance without a base plate was 19 mΩ, while with a base plate (1 cm diameter hole), the measured value was 19.2 mΩ. The classical value for Cu at 77 K is about 16.4 mΩ, while that predicted from anomalous skin effect analysis is about 19.7 mΩ. At Ka band frequencies and 77 K, the measured and anomalous theoretical data correspond reasonably well since the material is entering an anomalous skin effect regime. The results with the base plate suggest that small samples can also be tested accurately (although with some loss of sensitivity). The exact surface resistance of the gold in the base plate was found by testing a base plate with no hole and using Eq. 1. At 77 K and 36.135 GHz, $R_{sb} = 25.0$ mΩ (repeatable to within 0.2 mΩ). The properties of the dielectric base plate support were determined using a blank glass cover slide (150 μm, used for all base plates) above the Cu sample.

The values $\epsilon_1 = 3.9$ and $\epsilon_2 = 10^{-4}$ were found using Eq. 3 (77 K, 36.135 GHz).

Figure 3:
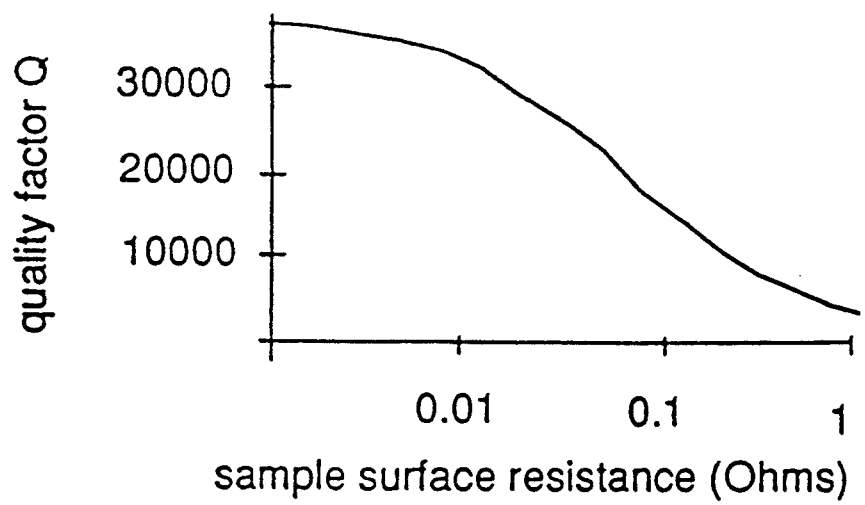
FIG. 3 is a graph showing variation of quality factor Q as a function of surface resistance for one particular mirror arrangement.

The sensitivity was estimated for superconducting samples. The curve in FIG. 3 shows the theoretical sensitivity of Q to the surface resistance of the superconductor when tested at 77 K and 36.135 GHz using a base plate with a 2 cm diameter hole (frequency shift due to dielectric). Since the left side of the x-axis represents some of the best HTS films currently available and the Q measurements are reproducible to within about 0.1%, this method is clearly appropriate for presently available HTS films. The estimated minimum measurable sample surface resistance at 36.1 GHz is 1 mΩ.

Figure 4:
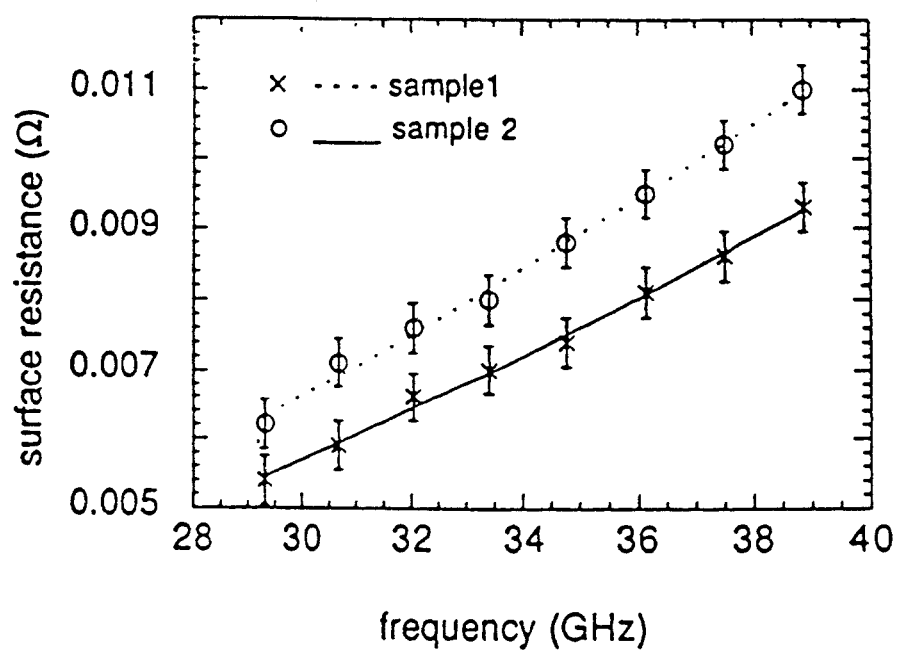
FIG. 4 is a graph depicting measured surface resistance as a function of frequency for two Tl films.

FIG. 4 depicts the measured $R_s$ data for two Tl films (700 nm thick) as a function of test frequency using a 9.5 mm base plate hole diameter. The error bars shown were determined from the scatter of repeated measurements. An exponential function curve fit gives an exponent of 1.9±0.5 and contradicts neither London theory nor Mattis-Bardeen predictions. The uncertainty is due to the small frequency range available for testing.

Figure 5:
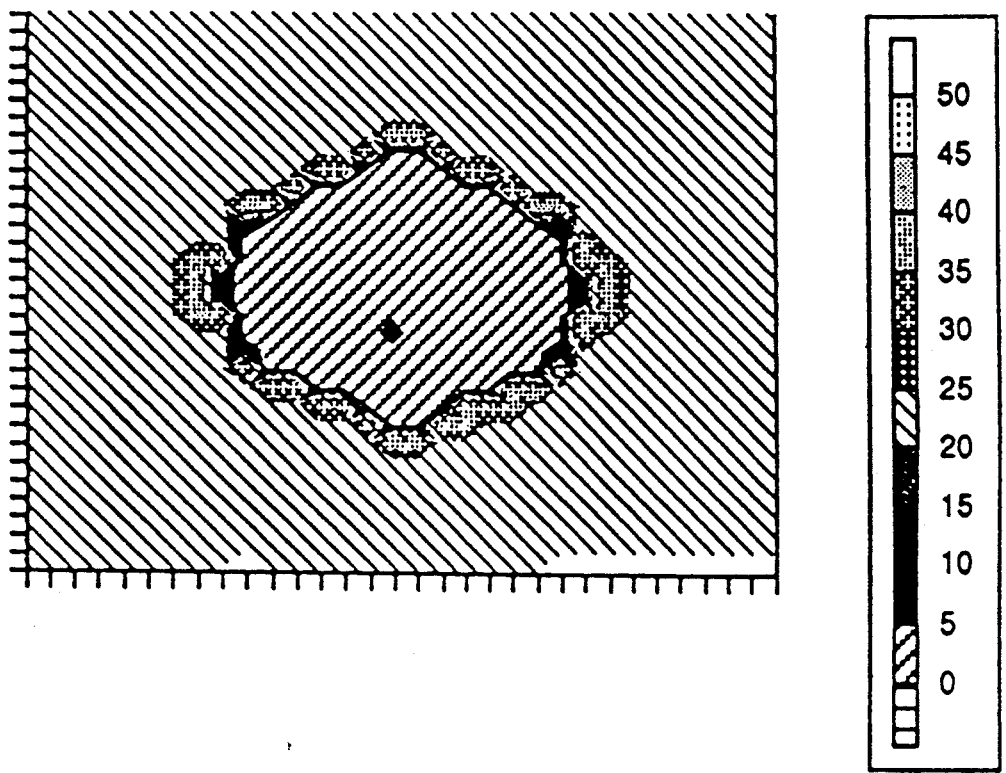
FIG. 5 displays an image of a surface resistance anomaly in a sample wafer surface.

However, wafers of superconducting or other films (semiconducting and normal metal) may often have defects that are not detectable optically. These defects or anomalies (non-stoichiometric regions, impurity inclusions, and the like) may affect the performance of circuitry, particularly in high speed systems, to be made from the material in question. The apparatus of the invention comprising the network analyzer and imaging equipment can be used to image these wafers in the sense of detecting minute variations in surface resistance as a function of position, as shown in FIG. 5, where 50 is the sample surface and 52 is a surface resistance anomaly thereon. Stepper motors incrementally move the sample in orthogonal directions, creating an image from a plurality of "spots."

Very small defects have been successfully detected (a 10 μm wide spot with a surface resistance 50% higher than that of the surrounding material or a 100 μm wide spot with a 10% deviation). The accuracy with which these defects can be localized is dependent on the radius of curvature of the mirror (smaller is better) and resonant frequency (larger is better). With present mirror designs and operation at 94 GHz, defects can be localized with sub millimeter precision. Standard image processing techniques, such as deconvolution, are used to improve the accuracy and precision of the scanned data.

The preceding examples can be repeated with similar success by substituting the generically or specifically described reactants and/or operating conditions of this invention for those used in the preceding examples.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all patents and publications cited above are hereby incorporated by reference.

What is claimed is:

1. Apparatus for determining and imaging surface resistance of a sample comprising:
   means for generating electromagnetic radiation in the frequency range of $10^9$ $10^{12}$ Hz;
   modified confocal resonator means for radiating said electromagnetic radiation;
   remote sample means for reflecting said electromagnetic radiation; and
   means for determining and imaging the surface resistance of said sample means from said reflected electromagnetic radiation.

2. The invention of claim 1 wherein said means for generating electromagnetic radiation comprises network analyzer means.

3. The invention of claim 1 wherein said modified confocal resonator means for radiating said electromagnetic radiation comprises mirror means having a radius of curvature b.

4. The invention of claim 3 wherein said remote sample means is positioned at a distance of b/2 from said mirror means.

5. The invention of claim 1 further comprising means for supercooling said sample means.

6. The invention of claim 1 wherein said means for determining and imaging the surface resistance of said sample means comprises said means for generating electromagnetic radiation.

7. The invention of claim 6 wherein said means for determining and imaging the surface resistance of said sample means comprises means for imaging surface resistance anomalies on the surface of said sample means.

8. The invention of claim 6 wherein said means for determining the surface resistance of said sample means further comprises means for determining $R_{ss}$ from the algorithm:

$$R_{s,sample} = \frac{\omega^2 \mu_0^2 b^3 \epsilon_0}{16\, Qbk(bk + 2)} - \frac{3\, bkR_{s,mirror}}{4\, (bk + 2)}$$

where the total quality factor, $Q_t$, is known, $R_{sm}$ (mirror surface resistance) is known, $\omega = 2\pi f_o$, $\mu_o = 4\pi 10^{-7}$ H/m, $\epsilon = 8.854 \cdot 10^{-12}$ F/m, and $k = \omega/3 \cdot 10^8$.

9. The invention of claim 1 further comprising means for coupling said means for generating electromagnetic radiation.

10. The invention of claim 9 wherein said means for coupling comprises waveguide means.

11. A method for determining and imaging the surface resistance of a sample comprising the steps of:
   a) generating electromagnetic radiation in the frequency range of $10^9$ to $10^{12}$ Hz;
   b) radiating the electromagnetic radiation by a modified confocal resonator;
   c) reflecting the radiated electromagnetic radiation from a remote sample; and
   d) determining and imaging surface resistance of the sample from the reflected electromagnetic radiation.

12. The invention of claim 11 wherein the step of generating electromagnetic radiation further comprises the step of providing a network analyzer.

13. The invention of claim 11 wherein the step of radiating the electromagnetic radiation by a modified confocal resonator further comprises the step of providing a mirror having a radius of curvature b.

14. The invention of claim 13 wherein the step of providing a mirror having a radius of curvature b further comprises the step of positioning the sample at a distance of b/2 from the mirror.

15. The invention of claim 11 wherein the step of reflecting the radiated electromagnetic radiation from a remote sample further comprises the step of supercooling the sample.

16. The invention of claim 11 wherein the steps of determining and imaging surface resistance of the sample from the reflected electromagnetic radiation further comprises the step of determining $R_{ss}$ from the algorithm:

$$R_{s,sample} = \frac{\omega^2 \mu_0^2 b^3 \epsilon_0}{16\, Qbk(bk + 2)} - \frac{3\, bkR_{s,mirror}}{4\, (bk + 2)}$$

where the total quality factor, $Q_t$, is known, $R_{sm}$ (mirror surface resistance) is known, $\omega = 2\pi f_o$, $\mu_o = 4\pi 10^{-7}$ H/m, $\epsilon = 8.854 \cdot 10^{-12}$ F/m, and $k = \omega/3 \cdot 10^8$.

17. The invention of claim 16 wherein the steps of determining and imaging surface resistance of the sample further comprise the step of imaging surface resistance anomalies on the surface of the sample.

18. The invention of claim 11 further comprising the step of coupling electromagnetic radiation.

19. The invention of claim 18 wherein the step of coupling electromagnetic radiation includes the step of providing a waveguide between the means for generating electromagnetic radiation and the means for radiating electromagnetic radiation.

20. Apparatus for determining and imaging surface resistance of a sample comprising:
   means for generating electromagnetic radiation;
   means for radiating said electromagnetic radiation comprising mirror means having a radius of curvature b;
   remote sample means positioned at a distance of b/2 from said mirror means for reflecting said electromagnetic radiation; and
   means for determining and imaging the surface resistance of said remote sample means from said reflected electromagnetic radiation.

21. The apparatus of claim 20 wherein said means for generating electromagnetic radiation comprises means for generating microwave radiation.

22. The apparatus of claim 20 wherein said mirror means comprises concave mirror means.

23. The apparatus of claim 20 further comprising means for supercooling said remote sample means.

24. The apparatus of claim 20 further comprising waveguide means for coupling said means for generating electromagnetic radiation to said means for radiating electromagnetic radiation.

25. A method for determining and imaging surface resistance of a sample comprising the steps of:
   a) generating electromagnetic radiation;
   b) radiating the electromagnetic radiation from a mirror having a radius of curvature b;
   c) positioning a remote sample at a distance of b/2 from the mirror for reflecting the electromagnetic radiation; and
   d) determining and imaging the surface resistance of the remote sample from the reflected electromagnetic radiation.

26. The method of claim 25 wherein the step of generating electromagnetic radiation comprises the step of generating microwave radiation.

27. The method of claim 25 wherein the step of radiating electromagnetic radiation from a mirror comprises the step of generating electromagnetic radiation from a concave mirror.

28. The method of claim 25 wherein the step of positioning a remote sample at a distance of b/2 from the mirror further comprises the step of supercooling the sample.

29. The method of claim 25 further comprising the step of coupling by waveguide the means for generating electromagnetic radiation and the means for radiating electromagnetic radiation.

* * * * *